(12) United States Patent
Nandwana et al.

(10) Patent No.: US 11,492,701 B2
(45) Date of Patent: Nov. 8, 2022

(54) REACTOR MANIFOLDS

(71) Applicant: ASM IP HOLDING B.V., Almere (NL)

(72) Inventors: Dinkar Nandwana, Tempe, AZ (US);
Jereld Lee Winkler, Gilbert, AZ (US);
Eric James Shero, Phoenix, AZ (US);
Todd Robert Dunn, Cave Creek, AZ (US); Carl Louis White, Gilbert, AZ (US)

(73) Assignee: ASM IP HOLDING B.V., Almere (NL)

( * ) Notice: Subject to any disclaimer, the term of this patent is extended or adjusted under 35 U.S.C. 154(b) by 123 days.

(21) Appl. No.: 16/813,527

(22) Filed: Mar. 9, 2020

(65) Prior Publication Data
US 2020/0299836 A1    Sep. 24, 2020

Related U.S. Application Data

(60) Provisional application No. 62/820,711, filed on Mar. 19, 2019.

(51) Int. Cl.
*C23C 16/44* (2006.01)
*H01L 21/67* (2006.01)
(Continued)

(52) U.S. Cl.
CPC .... *C23C 16/4409* (2013.01); *C23C 16/45527* (2013.01); *C23C 16/45544* (2013.01);
(Continued)

(58) Field of Classification Search
CPC .......... C23C 16/4409; C23C 16/45527; C23C 16/45544; C23C 16/54; C23C 16/45561;
(Continued)

(56) References Cited

U.S. PATENT DOCUMENTS 1,523,156 A    1/1925   Adams
1,853,045 A    4/1932   Gnau
(Continued)

FOREIGN PATENT DOCUMENTS

CN    101117308    2/2008
CN    104561937    4/2015
(Continued)

OTHER PUBLICATIONS

Baxter et al., "Chemical vapour deposition of electrochromic tungsten oxide films employing volatile tungsten(v1) 0×0 alkoxide/β-diketonate complexes", Chem. Commun., 1996, pp. 1129-1130.
(Continued)

*Primary Examiner* — Jeffrie R Lund
(74) *Attorney, Agent, or Firm* — Knobbe, Martens, Olson & Bear LLP

(57) ABSTRACT

Herein disclosed are systems and methods related to semiconductor processing device including a manifold including a bore configured to deliver a gas to a reaction chamber, the manifold including a first block mounted to a second block, the first and second mounted blocks cooperating to at least partially define the bore. A supply channel provides fluid communication between a gas source and the bore, and the supply channel is disposed at least partially in the second block. A metallic seal is disposed about the bore at an interface between the first and second block. Advantageously, the metallic seal improves sealing between the interface between the first block and the second block.

18 Claims, 4 Drawing Sheets

(51) Int. Cl.
*C23C 16/455* (2006.01)
*C23C 16/54* (2006.01)

(52) U.S. Cl.
CPC ........ *C23C 16/45561* (2013.01); *C23C 16/54* (2013.01); *H01L 21/67017* (2013.01)

(58) Field of Classification Search
CPC ........ C23C 16/45512; C23C 16/45574; C23C 16/4408; C23C 16/45548; C23C 16/45565; H01L 21/67017
See application file for complete search history.

(56) References Cited

U.S. PATENT DOCUMENTS

| | | |
|---|---|---|
| 3,429,903 A | 2/1969 | Larson |
| 3,784,631 A | 1/1974 | Menapace et al. |
| 3,882,934 A | 5/1975 | Knoos et al. |
| 3,913,617 A | 10/1975 | van Laar et al. |
| 4,222,671 A | 9/1980 | Gilmore |
| 4,401,052 A | 8/1983 | Baron et al. |
| 4,410,281 A | 10/1983 | Crookes |
| 4,422,773 A | 12/1983 | Cassaday et al. |
| 4,649,859 A | 3/1987 | Wanlass |
| 4,747,367 A | 5/1988 | Posa |
| 4,828,224 A | 5/1989 | Crabb et al. |
| 4,869,284 A | 9/1989 | Scott et al. |
| 4,889,609 A | 12/1989 | Cannella |
| 4,895,107 A | 1/1990 | Yano et al. |
| 4,907,534 A | 3/1990 | Huang et al. |
| 4,949,783 A | 8/1990 | Lakios et al. |
| 4,951,601 A | 8/1990 | Maydan et al. |
| 4,990,047 A | 2/1991 | Wagner et al. |
| 5,004,374 A | 4/1991 | Grey |
| 5,028,724 A | 7/1991 | Ivankovits et al. |
| 5,071,460 A | 12/1991 | Fujiura et al. |
| 5,080,549 A | 1/1992 | Goodwin et al. |
| 5,106,453 A | 4/1992 | Benko et al. |
| 5,121,705 A | 6/1992 | Sugino |
| 5,131,627 A | 7/1992 | Kolenc |
| 5,166,092 A | 11/1992 | Mochizuki et al. |
| 5,186,718 A | 2/1993 | Tepman et al. |
| 5,192,371 A | 3/1993 | Shuto et al. |
| 5,199,483 A | 4/1993 | Bahng |
| 5,217,501 A | 6/1993 | Fuse et al. |
| 5,223,001 A | 6/1993 | Saeki |
| 5,229,615 A | 7/1993 | Brune et al. |
| 5,248,253 A | 9/1993 | Philipossian et al. |
| 5,252,131 A | 10/1993 | Kiyama et al. |
| 5,284,519 A | 2/1994 | Gadgil |
| 5,286,296 A | 2/1994 | Sato et al. |
| 5,288,327 A | 2/1994 | Bhat |
| 5,350,453 A | 9/1994 | Scholosser |
| 5,388,944 A | 2/1995 | Takanabe et al. |
| 5,391,035 A | 2/1995 | Krueger |
| 5,405,446 A | 4/1995 | Nakajima et al. |
| 5,433,785 A | 7/1995 | Saito |
| 5,462,397 A | 10/1995 | Iwabuchi |
| 5,488,925 A | 2/1996 | Kumada |
| 5,516,732 A | 5/1996 | Flegal |
| 5,520,742 A | 5/1996 | Ohkase |
| 5,520,743 A | 5/1996 | Takahashi |
| 5,525,157 A | 6/1996 | Hawkins et al. |
| 5,538,390 A | 7/1996 | Salzman |
| 5,571,330 A | 11/1996 | Kyogoku |
| 5,586,585 A | 12/1996 | Bonora et al. |
| 5,601,651 A | 2/1997 | Watabe |
| 5,609,459 A | 3/1997 | Muka |
| 5,728,223 A | 3/1998 | Murakami et al. |
| 5,755,878 A | 5/1998 | Habuka et al. |
| 5,789,027 A | 8/1998 | Watkins et al. |
| 5,846,330 A | 12/1998 | Quirk et al. |
| 5,851,294 A | 12/1998 | Young et al. |
| 5,885,358 A | 3/1999 | Maydan et al. |
| 5,893,641 A | 4/1999 | Garcia |
| 5,938,840 A | 8/1999 | Habuka et al. |
| 5,951,771 A | 9/1999 | Raney et al. |
| 6,036,783 A | 3/2000 | Fukunaga et al. |
| 6,070,550 A | 6/2000 | Ravi et al. |
| 6,079,353 A | 6/2000 | Leksell et al. |
| 6,110,529 A | 8/2000 | Gardiner et al. |
| 6,114,227 A | 9/2000 | Leksell et al. |
| 6,126,996 A | 10/2000 | Kirlin et al. |
| 6,217,658 B1 | 4/2001 | Orczyk et al. |
| 6,224,676 B1 | 5/2001 | Nakajima et al. |
| 6,258,157 B1 | 7/2001 | Gordon |
| 6,299,692 B1 | 10/2001 | Ku et al. |
| 6,302,965 B1 | 10/2001 | Umotoy et al. |
| 6,303,501 B1 | 10/2001 | Chen et al. |
| 6,331,072 B1 | 12/2001 | Schierholz et al. |
| 6,375,750 B1 | 4/2002 | van Os et al. |
| 6,416,213 B1 | 7/2002 | Fukunaga |
| 6,482,740 B2 | 11/2002 | Soininen et al. |
| 6,534,133 B1 | 3/2003 | Kaloyeros et al. |
| 6,539,891 B1 | 4/2003 | Lee et al. |
| 6,660,177 B2 | 12/2003 | Carr |
| 6,783,590 B2 | 8/2004 | Lindfors et al. |
| 6,846,516 B2 | 1/2005 | Yang et al. |
| 6,878,628 B2 | 4/2005 | Sophie et al. |
| 6,881,263 B2 | 4/2005 | Lindfors et al. |
| 6,884,296 B2 | 4/2005 | Basceri et al. |
| 6,899,507 B2 | 5/2005 | Yamagishi et al. |
| 6,905,547 B1 | 6/2005 | Londergan et al. |
| 6,916,398 B2 | 7/2005 | Chen et al. |
| 6,921,712 B2 | 7/2005 | Soininen et al. |
| 7,018,478 B2 | 3/2006 | Lindfors et al. |
| 7,021,881 B2 | 4/2006 | Yamagishi et al. |
| 7,045,060 B1 | 5/2006 | Liles et al. |
| 7,163,587 B2 | 1/2007 | Kinnard et al. |
| 7,175,713 B2 | 2/2007 | Thakur et al. |
| 7,195,037 B2 | 3/2007 | Eidsmore |
| 7,204,886 B2 | 4/2007 | Chen et al. |
| 7,220,669 B2 | 5/2007 | Hujanen et al. |
| 7,297,892 B2 | 11/2007 | Kelley et al. |
| 7,304,263 B2 | 12/2007 | Chang et al. |
| 7,311,851 B2 | 12/2007 | Carr |
| 7,323,581 B1 | 1/2008 | Gardiner et al. |
| 7,402,210 B2 | 7/2008 | Chen et al. |
| 7,408,225 B2 | 8/2008 | Shinriki et al. |
| 7,416,994 B2 | 8/2008 | Quick |
| 7,494,927 B2 | 2/2009 | Kostamo et al. |
| 7,591,907 B2 | 9/2009 | Chen et al. |
| 7,591,957 B2 | 9/2009 | Carr |
| 7,638,645 B2 | 12/2009 | Gordon et al. |
| 7,670,399 B2 | 3/2010 | Park |
| 7,780,785 B2 | 8/2010 | Chen et al. |
| 7,780,789 B2 | 8/2010 | Wu et al. |
| 7,846,499 B2 | 12/2010 | Blomberg |
| 7,918,938 B2 | 4/2011 | Provencher et al. |
| 7,927,942 B2 | 4/2011 | Raaijmakers |
| 8,070,879 B2 | 12/2011 | Chen et al. |
| 8,137,463 B2 | 3/2012 | Liu et al. |
| 8,142,847 B2 | 3/2012 | Shenai-Khatkhate et al. |
| 8,152,922 B2 | 4/2012 | Schmidt et al. |
| 8,188,464 B2 | 5/2012 | Quick |
| 8,211,230 B2 | 7/2012 | Verghese et al. |
| 8,298,336 B2 | 10/2012 | Wang et al. |
| 8,372,201 B2 | 2/2013 | Provencher et al. |
| 8,399,056 B2 | 3/2013 | Blasco et al. |
| 8,425,682 B2 | 4/2013 | Wang et al. |
| 8,465,801 B2 | 6/2013 | Schmidt et al. |
| 8,668,776 B2 | 3/2014 | Chen et al. |
| 8,784,563 B2 | 7/2014 | Schmidt et al. |
| 8,809,170 B2 | 8/2014 | Bauer |
| 9,029,189 B2 | 5/2015 | Gordon et al. |
| 9,312,154 B2 | 4/2016 | Tran et al. |
| 9,359,672 B2 | 6/2016 | Verghese et al. |
| 9,388,492 B2 | 7/2016 | White et al. |
| 9,394,608 B2 | 7/2016 | Shero et al. |
| 9,567,672 B2 | 2/2017 | Kim et al. |
| 9,574,268 B1 | 2/2017 | Dunn et al. |
| 9,802,220 B2 | 10/2017 | Heys et al. |
| 9,863,039 B2 | 1/2018 | Min |
| 9,911,590 B2 | 3/2018 | Dussarrat et al. |

(56) References Cited

U.S. PATENT DOCUMENTS

| | | | |
|---|---|---|---|
| 10,131,984 B2 | 11/2018 | Okada | |
| 10,147,597 B1 | 12/2018 | Lee et al. | |
| 10,280,509 B2 | 5/2019 | Tzu et al. | |
| 10,358,407 B2 | 7/2019 | Hatanpaa et al. | |
| 10,370,761 B2 | 8/2019 | Dunn et al. | |
| 10,468,291 B2 | 11/2019 | Verghese et al. | |
| 10,480,072 B2 | 11/2019 | Shero et al. | |
| 10,662,527 B2 | 5/2020 | Marquardt | |
| 10,683,571 B2 | 6/2020 | Jdira et al. | |
| 10,844,486 B2 | 11/2020 | Shero et al. | |
| 11,014,866 B2 | 5/2021 | Hatanpaa et al. | |
| 11,047,042 B2 | 6/2021 | McKee et al. | |
| 2001/0003015 A1 | 6/2001 | Chang et al. | |
| 2001/0006093 A1 | 7/2001 | Tabuchi et al. | |
| 2001/0054377 A1 | 12/2001 | Lindfors et al. | |
| 2002/0007790 A1 | 1/2002 | Park | |
| 2002/0072164 A1 | 6/2002 | Umotoy et al. | |
| 2002/0081381 A1 | 6/2002 | DelaRosa et al. | |
| 2002/0113327 A1 | 8/2002 | Hara | |
| 2002/0170674 A1 | 11/2002 | Shapiro | |
| 2002/0195055 A1 | 12/2002 | Grant et al. | |
| 2003/0008072 A1 | 1/2003 | Lee et al. | |
| 2003/0010451 A1 | 1/2003 | Tzu et al. | |
| 2003/0019428 A1 | 1/2003 | Ku et al. | |
| 2003/0056720 A1 | 3/2003 | Dauelsberg et al. | |
| 2003/0070620 A1 | 4/2003 | Cooperberg et al. | |
| 2003/0079686 A1 | 5/2003 | Chen et al. | |
| 2003/0101938 A1 | 6/2003 | Ronsse et al. | |
| 2003/0106643 A1 | 6/2003 | Tabuchi et al. | |
| 2003/0172872 A1 | 9/2003 | Thakur et al. | |
| 2003/0180460 A1 | 9/2003 | Strauch et al. | |
| 2003/0194360 A1 | 10/2003 | Huziwara et al. | |
| 2003/0205096 A1 | 11/2003 | Gehner et al. | |
| 2004/0016404 A1* | 1/2004 | Gregg | F17C 11/00 |
| | | | 118/726 |
| 2004/0002881 A1 | 2/2004 | Grant et al. | |
| 2004/0035358 A1 | 2/2004 | Basceri et al. | |
| 2004/0043557 A1 | 3/2004 | Haukka et al. | |
| 2004/0113289 A1 | 6/2004 | Toda et al. | |
| 2004/0118342 A1 | 6/2004 | Cheng et al. | |
| 2004/0144311 A1 | 7/2004 | Chen et al. | |
| 2004/0197090 A1 | 10/2004 | Kudo | |
| 2004/0217217 A1 | 11/2004 | Han et al. | |
| 2004/0221807 A1 | 11/2004 | Verghese et al. | |
| 2004/0224504 A1 | 11/2004 | Gadgil | |
| 2005/0000428 A1 | 1/2005 | Shero et al. | |
| 2005/0000656 A1 | 1/2005 | Carr | |
| 2005/0009325 A1 | 1/2005 | Chung et al. | |
| 2005/0092247 A1 | 5/2005 | Schmidt et al. | |
| 2005/0173068 A1 | 8/2005 | Chen et al. | |
| 2005/0208217 A1 | 9/2005 | Shinriki et al. | |
| 2005/0241176 A1 | 11/2005 | Shero et al. | |
| 2005/0252449 A1 | 11/2005 | Nguyen et al. | |
| 2005/0263197 A1 | 12/2005 | Eidsmore | |
| 2005/0271812 A1 | 12/2005 | Myo et al. | |
| 2006/0053833 A1 | 3/2006 | Martins et al. | |
| 2006/0096540 A1 | 5/2006 | Choi | |
| 2006/0266289 A1 | 11/2006 | Verghese et al. | |
| 2007/0001326 A1 | 1/2007 | Toda et al. | |
| 2007/0026147 A1 | 2/2007 | Chen et al. | |
| 2007/0081923 A1 | 4/2007 | Choe et al. | |
| 2007/0095285 A1 | 5/2007 | Thakur et al. | |
| 2007/0098894 A1 | 5/2007 | Verghese et al. | |
| 2007/0128864 A1 | 6/2007 | Ma et al. | |
| 2007/0187634 A1 | 8/2007 | Sneh | |
| 2007/0194470 A1 | 8/2007 | Dedontney | |
| 2008/0037968 A1 | 2/2008 | Kaastra | |
| 2008/0085226 A1 | 4/2008 | Fondurulia et al. | |
| 2008/0102203 A1 | 5/2008 | Wu et al. | |
| 2008/0102208 A1 | 5/2008 | Wu et al. | |
| 2008/0115740 A1 | 5/2008 | You | |
| 2008/0202416 A1 | 8/2008 | Provencher et al. | |
| 2008/0241387 A1 | 10/2008 | Keto | |
| 2008/0254218 A1 | 10/2008 | Xinjian et al. | |
| 2008/0027161 A1 | 11/2008 | Vedsted et al. | |
| 2009/0095222 A1 | 4/2009 | Tam et al. | |
| 2009/0196992 A1 | 8/2009 | Schmidt et al. | |
| 2009/0215912 A1 | 8/2009 | Goto et al. | |
| 2009/0320754 A1 | 12/2009 | Oya et al. | |
| 2010/0003406 A1 | 1/2010 | Lam et al. | |
| 2010/0024727 A1 | 2/2010 | Kim et al. | |
| 2010/0048032 A1 | 2/2010 | Sangam et al. | |
| 2010/0092163 A1 | 4/2010 | Yeung | |
| 2010/0150756 A1 | 6/2010 | Chow et al. | |
| 2010/0255198 A1* | 10/2010 | Cleary | C23C 16/45544 |
| | | | 427/255.39 |
| 2010/0266765 A1 | 10/2010 | White et al. | |
| 2010/0296800 A1 | 11/2010 | Min et al. | |
| 2010/0310772 A1 | 12/2010 | Tsuda | |
| 2011/0098841 A1 | 4/2011 | Tsuda | |
| 2011/0111136 A1 | 5/2011 | Slevin et al. | |
| 2011/0116776 A1 | 5/2011 | Wheeler et al. | |
| 2011/0128814 A1 | 6/2011 | Hanada | |
| 2011/0162580 A1 | 7/2011 | Provencher et al. | |
| 2011/0199855 A1 | 8/2011 | Hanada | |
| 2011/0223334 A1 | 9/2011 | Yudovsky et al. | |
| 2012/0079984 A1 | 4/2012 | Schmidt et al. | |
| 2012/0289057 A1 | 11/2012 | DeDontney | |
| 2012/0307589 A1 | 12/2012 | Hanada | |
| 2013/0058835 A1 | 3/2013 | Salazar-Guillen et al. | |
| 2013/0061759 A1 | 3/2013 | Laor et al. | |
| 2013/0091933 A1 | 4/2013 | Tsukada et al. | |
| 2013/0160709 A1 | 6/2013 | White et al. | |
| 2013/0206338 A1 | 8/2013 | Tanaka | |
| 2013/0333620 A1 | 12/2013 | Li et al. | |
| 2013/0333768 A1* | 12/2013 | Chandrasekharan | C23C 16/45561 |
| | | | 137/238 |
| 2014/0120031 A1 | 5/2014 | Yang et al. | |
| 2014/0141165 A1 | 5/2014 | Sato et al. | |
| 2014/0261178 A1 | 9/2014 | Du Bois et al. | |
| 2014/0284404 A1 | 9/2014 | Kuah et al. | |
| 2015/0104161 A1 | 4/2015 | De Mango et al. | |
| 2015/0176126 A1 | 6/2015 | Ge et al. | |
| 2015/0211112 A1 | 7/2015 | Cadot et al. | |
| 2015/0232355 A1 | 8/2015 | Ghaffour et al. | |
| 2015/0240359 A1 | 8/2015 | Jdira | |
| 2015/0371831 A1 | 12/2015 | Rozenzon et al. | |
| 2015/0377481 A1 | 12/2015 | Smith et al. | |
| 2016/0108523 A1* | 4/2016 | Lee | C23C 16/45561 |
| | | | 156/89.11 |
| 2016/0122868 A1 | 5/2016 | Kim et al. | |
| 2016/0222508 A1 | 8/2016 | Schoepp et al. | |
| 2016/0256889 A1* | 9/2016 | Jones | B05C 5/0279 |
| 2016/0281232 A1 | 9/2016 | White et al. | |
| 2017/0121818 A1 | 5/2017 | Dunn et al. | |
| 2017/0216796 A1 | 8/2017 | Sameshima | |
| 2017/0350011 A1 | 12/2017 | Marquardt | |
| 2019/0032206 A1* | 1/2019 | Hodges | C23C 16/4483 |
| 2019/0195378 A1* | 6/2019 | Aikawa | F17D 3/01 |
| 2019/0264326 A1* | 8/2019 | Doya | C23C 16/45544 |
| 2020/0056286 A1 | 2/2020 | Shero et al. | |
| 2020/0248308 A1 | 8/2020 | Marquardt | |
| 2020/0299836 A1* | 9/2020 | Nandwana | C23C 16/45527 |
| 2020/0354835 A1* | 11/2020 | Watanabe | F16K 27/003 |
| 2021/0118668 A1* | 4/2021 | Nandwana | C23C 16/45561 |

FOREIGN PATENT DOCUMENTS

| | | |
|---|---|---|
| DE | 3715644 | 12/1988 |
| JP | H09-186111 | 7/1997 |
| JP | 2008-264640 | 11/2008 |
| JP | 4667541 B2 | 4/2011 |
| JP | 2011-104482 | 6/2011 |
| JP | 2011-104483 | 6/2011 |
| JP | 2011-246466 | 12/2011 |
| JP | 2012-099594 | 5/2012 |
| JP | 2013-075281 | 4/2013 |
| KR | 10-1464173 | 11/2014 |
| WO | WO 90/10092 | 9/1990 |
| WO | WO 1996/40690 | 12/1996 |
| WO | WO 01/29282 A2 | 4/2001 |
| WO | WO 2002/18394 | 3/2002 |

(56) References Cited

FOREIGN PATENT DOCUMENTS

| WO | WO 2008/002546 | 1/2008 |
|---|---|---|
| WO | WO 2010/047168 A1 | 4/2010 |
| WO | WO 2010/114386 | 10/2010 |
| WO | WO 2014/163742 A1 | 10/2014 |
| WO | WO 2013/111789 | 5/2015 |

OTHER PUBLICATIONS

Bonsu et al., "Synthesis and evaluation of κ2-β-diketonate and β-ketoesterate tungsten(VI) oxo-alkoxide complexes as precursors for chemical vapor deposition of WOx thin films", Dalton Trans., 2016, 45, pp. 10897-10908.

Browning et al., "Atomic layer deposition of MoS2 films", Mater. Res. Express 2, 2015, 6 pages.

Buono-Core et al., "Synthesis and evaluation of bis-β-diketonate dioxotungsten(VI) complexes as precursors for the photodeposition of WO3 films", Polyhedron, 30, 2011, pp. 201-206.

Chisholm et al., "The Molybdenum-Molybdenum Triple Bond. 13.1 Preparations and Characterization of Bis(P-diketonato)tetraalkoxydimolybdenum and -ditungsten Compounds", Inorg. Chem., 1984, 23, pp. 613-618.

Chisholm et al., "Reactions of Metal-Metal Multiple Bonds. 11.1 A Comparison of the Reactivity of M2(OR)6 (M≡M) and M2(OR)4(R'COCHCOR')2 (M≡M) Compounds (M = Mu, W) with the π-Acid Ligands Co, RC≡CR, and RNC", Inorg. Chem., 1984, 23, pp. 1037-1042.

Doyle, "The Reaction of Some Molybdenum and Tungsten Halides with .beta.-Diketones", Inorganic Chemistry, vol. 10, No. 10, 1971, pp. 2348-2350.

Kang et al., "High-mobility three-atom-thick semiconducting films with wafer-scale homogeneity", Nature, Apr. 30, 2015, vol. 520, pp. 656-660.

Lee et al., "Effects of Oxidation State and Crystallinity of Tugsten Oxide Interlayer on Photovoltaic Property in Bulk Hetero-Junction Solar Cell", J. Phys. Chem. 2012, 116, pp. 13480-13487.

Mazurenko et al., "Synthesis, thermal stability, and IR and UV spectra of molybdenum and tungsten β-diketone complexes", Probl. Khim. Primen. β [Beta]-Diketonatov Met., (Mater. Vses. Semin.) (1982).

Zelazowlska et al., "WO3-based electrochromic system with hybrid organic-inorganic gel electrolytes", Journal of Non-Crystalline Solids, 354, 2008, pp. 4500-4505.

* cited by examiner

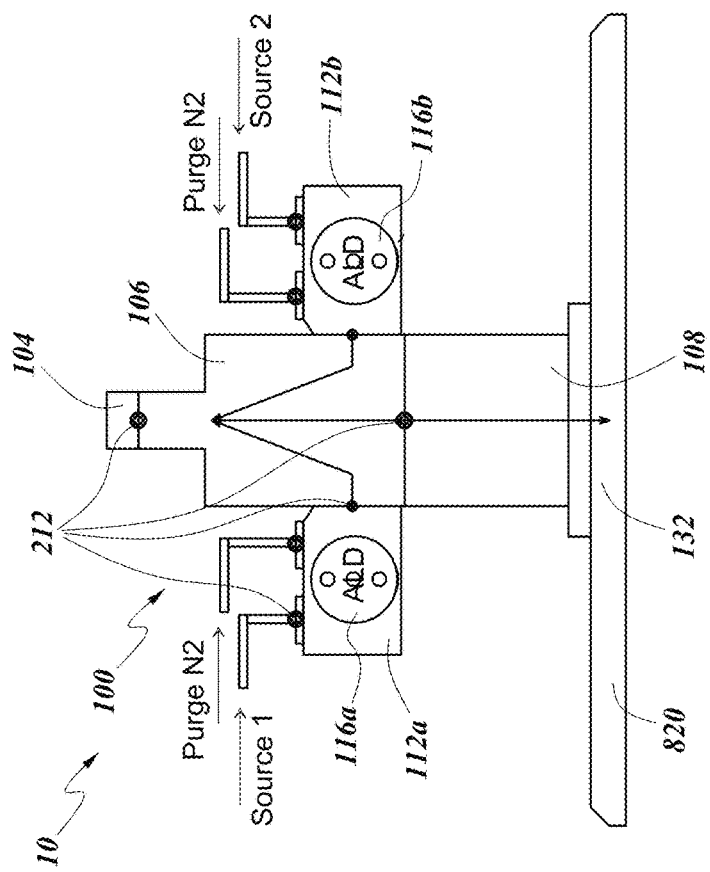
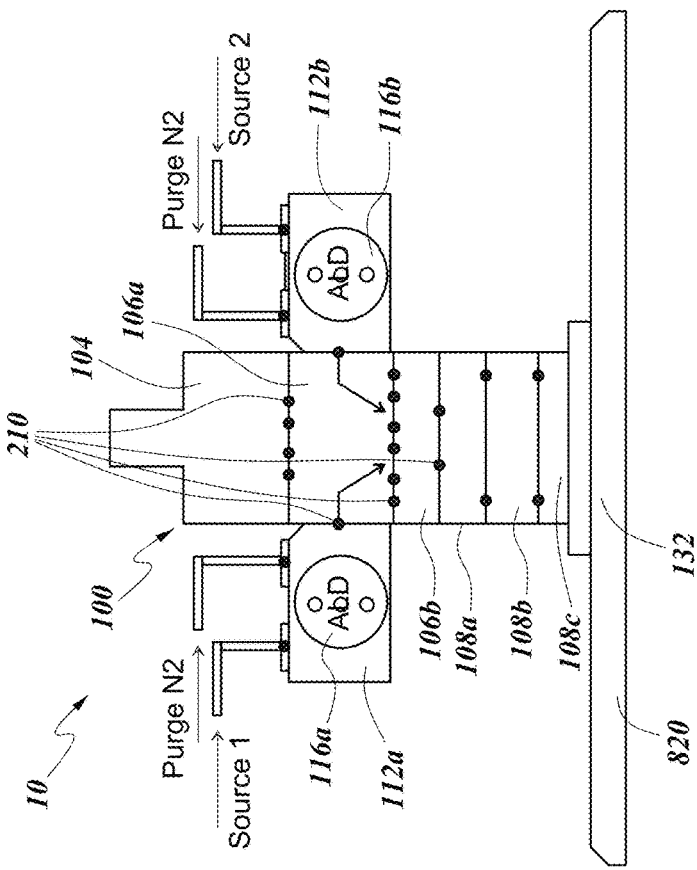
FIG. 3A
FIG. 3B

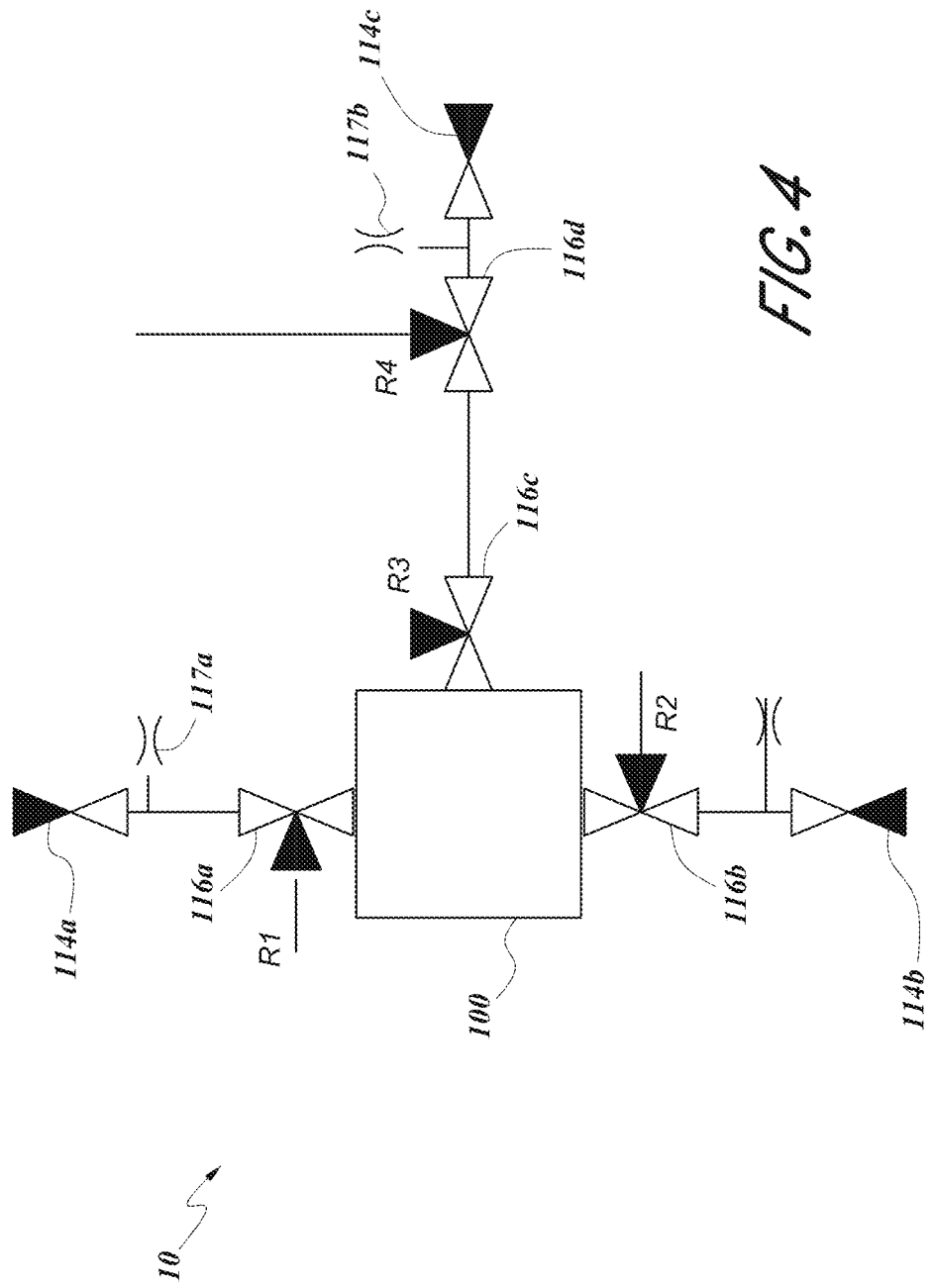

REACTOR MANIFOLDS

CROSS-REFERENCE TO RELATED APPLICATIONS

This application claims the benefit of priority to U.S. Provisional Application No. 62/820,711, filed Mar. 19, 2019, titled REACTOR MANIFOLDS, which is hereby incorporated by reference herein in its entirety.

BACKGROUND

Field

The field relates generally to manifolds for vapor deposition, and, in particular, to manifolds for improving the quality of deposition in an atomic layer deposition (ALD) reactor.

Description of the Related Art

There are several vapor deposition methods for depositing thin films on surfaces of substrates. These methods include vacuum evaporation deposition, Molecular Beam Epitaxy (MBE), different variants of Chemical Vapor Deposition (CVD) (including low-pressure and organometallic CVD and plasma-enhanced CVD), and Atomic Layer Deposition (ALD).

In an ALD process, one or more substrates with at least one surface to be coated are introduced into a deposition chamber. The substrate is heated to a desired temperature, typically above the condensation temperatures of the selected vapor phase reactants and below their thermal decomposition temperatures. One reactant is capable of reacting with the adsorbed species of a prior reactant to form a desired product on the substrate surface. Two, three or more reactants are provided to the substrate, typically in spatially and temporally separated pulses.

In an example, in a first pulse, a first reactant representing a precursor material is adsorbed largely intact in a self-limiting process on a wafer. The process is self-limiting because the vapor phase precursor cannot react with or adsorb upon the adsorbed portion of the precursor. After any remaining first reactant is removed from the wafer or chamber, the adsorbed precursor material on the substrate reacted with a subsequent reactant pulse to form no more than a single molecular layer of the desired material. The subsequent reactant may, e.g., strip ligands from the adsorbed precursor material to make the surface reactive again, replace ligands and leave additional material for a compound, etc. In an unadulterated ALD process, less than a monolayer is formed per cycle on average due to steric hindrance, whereby the size of the precursor molecules prevent access to adsorption sites on the substrate, which may become available in subsequent cycles. Thicker films are produced through repeated growth cycles until the target thickness is achieved. Growth rate is often provided in terms of angstroms per cycle because in theory the growth depends solely on number of cycles, and has no dependence upon mass supplied or temperature, as long as each pulse is saturative and the temperature is within the ideal ALD temperature window for those reactants (no thermal decomposition and no condensation).

Reactants and temperatures are typically selected to avoid both condensation and thermal decomposition of the reactants during the process, such that chemical reaction is responsible for growth through multiple cycles. However, in certain variations on ALD processing, conditions can be selected to vary growth rates per cycle, possibly beyond one molecular monolayer per cycle, by utilizing hybrid CVD and ALD reaction mechanisms. Other variations maybe allow some amount of spatial and/or temporal overlap between the reactants. In ALD and other sequential vapor deposition variations thereof, two, three, four or more reactants can be supplied in sequence in a single cycle, and the content of each cycle can be varied to tailor composition.

During a typical ALD process, the reactant pulses, all of which are in vapor form, are pulsed sequentially into a reaction space (e.g., reaction chamber) with removal steps between reactant pulses to avoid direct interaction between reactants in the vapor phase. For example, inert gas pulses or "purge" pulses can be provided between the pulses of reactants. The inert gas purges the chamber of one reactant pulse before the next reactant pulse to avoid gas phase mixing. To obtain a self-limiting growth, a sufficient amount of each precursor is provided to saturate the substrate. As the growth rate in each cycle of a true ALD process is self-limiting, the rate of growth is proportional to the repetition rate of the reaction sequences rather than to the flux of reactant.

SUMMARY

In one aspect, a semiconductor processing device is provided which includes: a manifold including: a bore configured to deliver a gas to a reaction chamber; a first block mounted to a second block, the first and second mounted blocks cooperating to at least partially define the bore; and a supply channel that provides fluid communication between a gas source and the bore, the supply channel disposed at least partially in the second block. The semiconductor processing device further includes a metallic seal disposed about the bore at an interface between the first and second block.

In some embodiments, the metallic seal is a C seal. The metallic seal can be steel. In some embodiments, the metallic seal can be a W seal. The semiconductor processing device may further include an outlet at a lower portion of the manifold. The supply channel may be angled upwardly away from the outlet and inwardly towards the bore. The first block may include an impingement surface at an upper portion of the manifold, the impingement surface shaped to redirect gas downwardly through the bore to the outlet. The impingement surface and the outlet may be disposed along a longitudinal axis of the bore.

In some embodiments, the semiconductor processing device further includes a third block mounted to and below the second block, a second metallic seal between the second and third blocks and at least partially disposed about the bore, where the second and third blocks cooperate to at least partially define the bore. The outlet may be at least partially defined by the third block.

In some embodiments, the semiconductor processing device further includes a gas dispersion device downstream of the outlet, the gas dispersion device configured to disperse a flow of the gas into a reaction chamber. The semiconductor processing device may further include the reaction chamber downstream of the gas dispersion device, the reaction chamber configured to receive a substrate. In some embodiments, the semiconductor processing device further includes a valve block mounted to the first block and a second metallic seal disposed between the valve block and the first block, a reactant gas valve mounted to or coupled with the valve block.

In another aspect, a semiconductor processing device is provided which includes: a manifold comprising: a bore configured to deliver a gas to a reaction chamber and an impingement surface at an upper portion of the manifold. The semiconductor processing device further includes an outlet at a lower portion of the manifold and a supply channel that provides fluid communication between a gas source and the bore, the supply channel is angled upwardly away from the outlet and inwardly towards the bore, the supply channel oriented to direct gas upwardly towards the impingement surface, and the impingement surface is shaped to redirect gas downwardly through the bore to the outlet.

In some embodiments, the manifold includes a first block mounted to a second block, the first and second mounted blocks cooperating to at least partially define the bore, the first block includes the impingement surface. The semiconductor processing device may further include a metallic seal disposed at least partially about the bore between the first and second blocks. The impingement surface and the outlet may be disposed along a longitudinal axis of the bore. The semiconductor processing device may further include a showerhead below the outlet, the showerhead configured to laterally disperse a flow of the gas. The semiconductor processing device may further include a reaction chamber below the showerhead, the reaction chamber configured to receive a substrate. In some embodiments, the outlet opens without restriction into a reaction chamber configured to house one or more substrates.

BRIEF DESCRIPTION OF THE DRAWINGS

These and other features, aspects and advantages of the present invention will now be described with reference to the drawings of several embodiments, which embodiments are intended to illustrate and not to limit the invention.

FIG. 3A is a schematic cross sectional view of the semiconductor processing device shown in FIGS. 1 and 2A.

FIG. 3B is a schematic cross sectional view of the semiconductor processing device of FIG. 2B.

FIG. 4 is a schematic view of the semiconductor processing device of FIGS. 2B and 3B illustrating the placement of valves.

DETAILED DESCRIPTION

Figure 1:
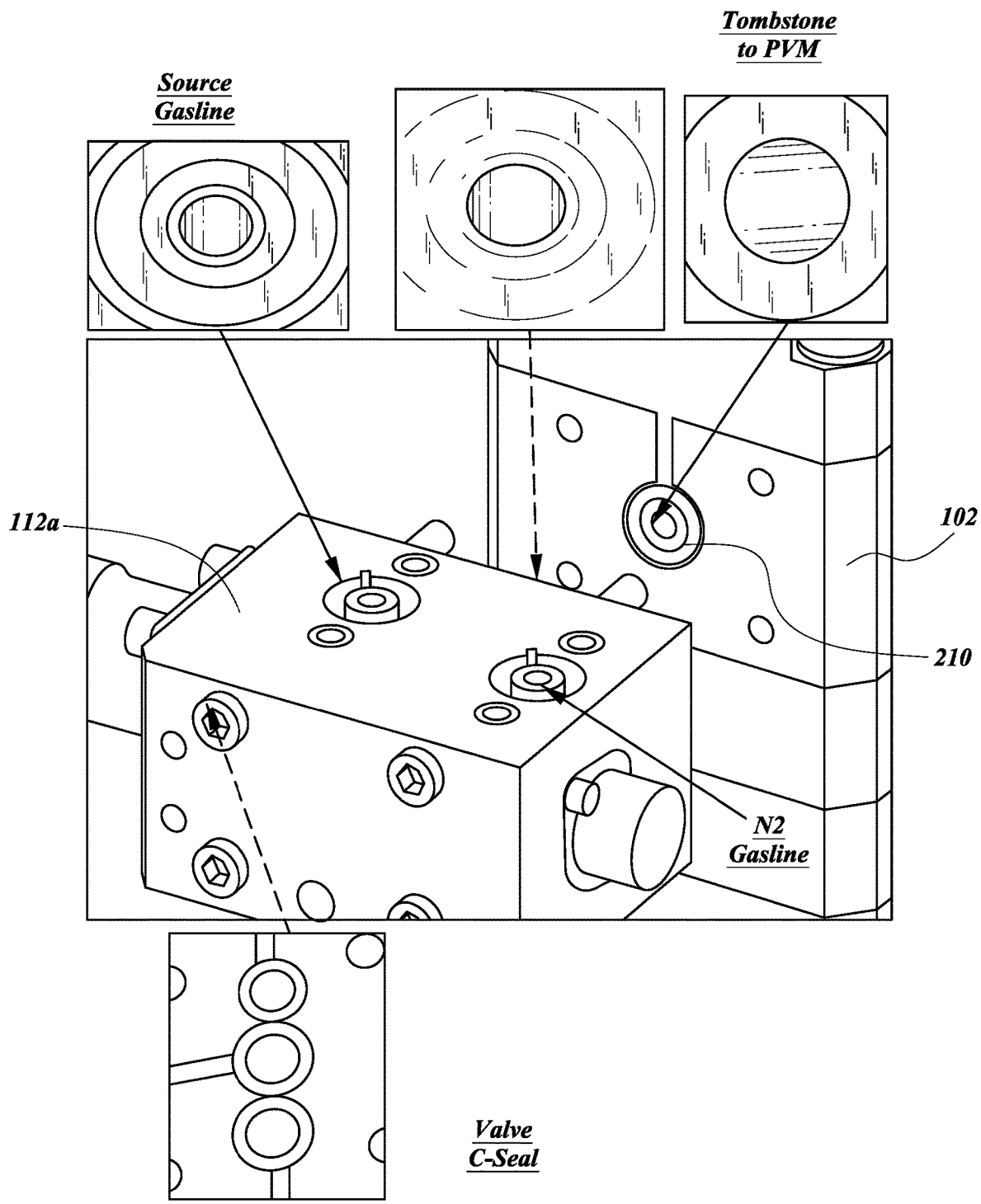
FIG. 1 is an exploded perspective view of an embodiment of a manifold of a semiconductor processing device, with inset images showing magnified portions of the manifold.

The embodiments disclosed herein can be utilized with semiconductor processing devices configured for any suitable gas or vapor deposition process, including processes that alternate reactant exposures (e.g., pulses) to the substrate. For example, the illustrated embodiments show various systems for depositing material on a substrate using atomic layer deposition (ALD) techniques. Among vapor deposition techniques, ALD has many advantages, including high conformality at low temperatures and fine control of composition during the process. ALD type processes are based on controlled, self-limiting surface reactions of precursor chemicals. Gas phase reactions are avoided by feeding the precursors alternately and sequentially into the reaction chamber. Vapor phase reactants are separated from each other in the reaction chamber, for example, by removing excess reactants and/or reactant by-products from the reaction chamber between reactant pulses. Removal can be accomplished by a variety of techniques, including purging and/or lowering pressure between pulses. Pulses can be sequential in a continuous flow, or the reactor can be isolated and can backfilled for each pulse. Of course, the equipment disclosed herein can be useful for other vapor deposition processes, particularly those in which alternation of reactants is desired, such that processes employed by the equipment may include some degree of thermal decomposition and/or overlap of precursor spatially or temporally.

Briefly, a substrate is loaded into a reaction chamber and is heated to a suitable deposition temperature, generally at lowered pressure. Deposition temperatures are typically maintained below the precursor thermal decomposition temperature but at a high enough level to avoid condensation of reactants and to provide the activation energy for the desired surface reactions. Of course, the appropriate temperature window for any given ALD reaction will depend upon the surface termination and reactant species involved, and processes that allow for either condensation or thermal decomposition can be conducted with equipment described herein.

A first reactant is conducted into the chamber in the form of vapor phase pulse and contacted with the surface of a substrate. Conditions are preferably selected such that no more than about one monolayer of the precursor is adsorbed on the substrate surface in a self-limiting manner. Excess first reactant and reaction byproducts, if any, are purged from the reaction chamber, often with a pulse of inert gas such as nitrogen or argon.

Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times for a single wafer reactor are from about 0.05 to 20 seconds, particularly between about 1 and 10 seconds, and still more particularly between about 1 and 2 seconds. However, other purge times can be utilized if desired, such as when depositing layers over extremely high aspect ratio structures or other structures with complex surface morphology is needed, or when a high volume batch reactor is employed. The appropriate pulsing times can be readily determined by the skilled artisan based on the particular circumstances.

A second gaseous reactant is pulsed into the chamber where it reacts with the first reactant bound to the surface. Excess second reactant and gaseous by-products of the surface reaction are purged out of the reaction chamber, preferably with the aid of an inert gas. The steps of pulsing and purging are repeated until a thin film of the desired thickness has been formed on the substrate, with each cycle leaving no more than a molecular monolayer. Some ALD processes can have more complex sequences with three or more precursor pulses alternated, where each precursor contributes elements to the growing film. Reactants can also be supplied in their own pulses or with precursor pulses to strip or getter adhered ligands and/or free by-product, rather than contribute elements to the film. Additionally, not all cycles need to be identical. For example, a binary film can be doped with a third element by infrequent addition of a third reactant pulse, e.g., every fifth cycle, in order to control stoichiometry of the film, and the frequency can change during the deposition in order to grade film composition. Moreover, while described as starting with an adsorbing reactant, some recipes may start with the other reactant or with a separate surface treatment, for example to ensure maximal reaction sites to initiate the ALD reactions (e.g., for certain recipes, a water pulse can provide hydroxyl groups on the substrate to enhance reactivity for certain ALD precursors).

As mentioned above, each pulse or phase of each cycle is preferably self-limiting for ALD reactions. An excess of reactant precursors is supplied in each phase to saturate the susceptible structure surfaces. Surface saturation ensures reactant occupation of all available reactive sites (subject, for example, to physical size or steric hindrance restraints) and thus ensures excellent step coverage over any topography on the substrate. In some arrangements, the degree of self-limiting behavior can be adjusted by, e.g., allowing some overlap of reactant pulses to trade off deposition speed (by allowing some CVD-type reactions) against conformality. Ideal ALD conditions with reactants well separated in time and space provide near perfect self-limiting behavior and thus maximum conformality, but steric hindrance results in less than one molecular layer per cycle. Limited CVD reactions mixed with the self-limiting ALD reactions can raise the deposition speed. While embodiments described herein are particularly advantageous for sequentially pulsed deposition techniques, like ALD and mixed-mode ALD/CVD, the manifold can also be employed for pulsed or continuous CVD processing. Many kinds of reactors capable of ALD growth of thin films, including CVD reactors equipped with appropriate equipment and means for pulsing the precursors, can be employed. In some embodiments a flow type ALD reactor is used, as compared to a backfilled reactor. In some embodiments, the manifold is upstream of an injector designed to distribute gas into the reaction space, particularly a dispersion mechanism such as a showerhead assembly above a single-wafer reaction space.

Many kinds of reactors capable of ALD growth of thin films, including CVD reactors equipped with appropriate equipment and means for pulsing the precursors, can be employed. In some embodiments a flow type ALD reactor is used, as compared to a backfilled reactor. In some embodiments, the manifold is upstream of an injector designed to distribute gas into the reaction space, particularly a dispersion mechanism such as a showerhead assembly above a single-wafer reaction space.

The ALD processes can optionally be carried out in a reaction chamber or space connected to a cluster tool. In a cluster tool, because each reaction space is dedicated to one type of process, the temperature of the reaction space in each module can be kept constant, which improves the throughput compared to a reactor in which is the substrate is heated to the process temperature before each run. A stand-alone reactor can be equipped with a load-lock. In that case, it is not necessary to cool down the reaction chamber or space between each run. These processes can also be carried out in a reactor designed to process multiple substrates simultaneously, e.g., a mini-batch type showerhead reactor.

Various embodiments disclosed herein relate to a semiconductor device, such as a vapor deposition device (e.g., an ALD device, a CVD device, etc.), that includes a manifold for delivering reactant vapor(s) to a reaction chamber. Regardless of the natural state of the chemicals under standard conditions, the reactant vapors may be referred to as "gases" herein. The embodiments disclosed herein can beneficially provide an effective fluid seal for the bore of the manifold. For example, in various embodiments, metallic seals (e.g., C seals) can be provided between adjacent blocks to inhibit the flow of gas (e.g., air) from the outside environs into the manifold. Moreover, the embodiments disclosed herein can provide an extended mixing length by, e.g., directing reactant gas upwardly through the supply channels at an angle and directing the reactant gases back downwardly through the bore. The disclosed embodiments can accordingly provide improved sealing, extended mixing length, and reduced non-uniformities at the substrate.

FIG. 1 illustrates an exploded view of a valve block 112a configured to be mounted to a manifold body 102 of a manifold 100. FIG. 2A is a schematic side sectional view of a semiconductor processing device 10 that can include the manifold 100 to deliver a gas to a reaction chamber (not shown). The semiconductor processing device 10 and manifold 100 shown in FIG. 2A may be generally similar to the semiconductor processing devices and manifolds shown and described in U.S. Pat. No. 9,574,268 and U.S. Patent Publication No. US 2017-0350011, the disclosures of which are incorporated by reference herein in their entirety and for all purposes. There may be various differences between the manifolds described in the U.S. Pat. No. 9,574,268 and U.S. Patent Publication No. US 2017-0350011 and the manifold 100 of FIG. 2A, but the overall functionality and design may be similar to, e.g., FIGS. 6A-6J and/or FIGS. 8A-8F of U.S. Pat. No. 9,574,268 and U.S. Patent Publication No. US 2017-0350011. Furthermore, the manifold of the present disclosure can be combined with the valves of FIG. 2 of U.S. Pat. No. 9,574,268 and U.S. Patent Publication No. US 2017-0350011; and/or combined with the reactant/inert gas sources, gas dispersion mechanism, controller, reaction chamber and vacuum source of FIG. 3A of U.S. Pat. No. 9,574,268 and U.S. Patent Publication No. US 2017-0350011.

The manifold 100 can include the manifold body 102 connected with valve blocks 112a, 112b, shown on opposite sides of the manifold body 102. Reactant valves and inert gas valves (not shown) are disposed on the blocks 112a, 112b, or on other upstream blocks (not shown). An inert gas inlet 120 can supply inert gas to the manifold 100, for example, from an upper portion of the manifold 100. The manifold body 102 comprises multiple blocks stacked on one another to at least partially define a bore 130 along which gas(es) flow, including, for example, an upper block 104, an intermediate block 106, and a lower block 108. In the arrangement of FIG. 2A, the intermediate block 106 comprises a sub-block 106a and a sub-block 106b. The lower block 108 comprises a first sub-block 108a, a second sub-block 108b, and a third sub-block 108c. As explained in U.S. Pat. No. 9,574,268 and U.S. Patent Publication No. US 2017-0350011, the use of multiple blocks and sub-blocks can enable a modular construction of the manifold 100 which can enable the use of internal channels with curved or angled shapes and other internal lumens.

FIG. 2A is a modified version of the manifold described with respect to FIGS. 6A-6J of U.S. Pat. No. 9,574,268 and U.S. Patent Publication No. US 2017-0350011. The sub-blocks 108a-108c can define an extended mixing length pathway 180 having a first lateral portion 180a, an offset axial portion 180b, and a second lateral portion 180b. The pathway 180 can provide an extended mixing length downstream of where the supply gases are introduced to the bore 130. The manifold 100 can include a plurality of gas distribution channels, including gas distribution channel 136 shown in FIG. 2A. Supply channels 138a-c convey gases from the distribution channel 136 to the bore 130. As shown, the supply channels 138a-c comprise angled supply channels that are angled downwardly to join the bore 130, where the flow is also downward toward an outlet 132. In the arrangement of FIG. 2A, gas flows through the bore 130, including along the extended mixing length pathway 180, and exits the manifold 100 through the outlet 132. The outlet 132 can be disposed over a dispersion mechanism, such as a showerhead, which can disperse the gas over the substrate in a reaction chamber (not shown).

Although the arrangement of FIG. 2A can beneficially provide an extended mixing length, the extended mixing length pathway 180 and other pathways in the manifold 100 includes curvature and turns which may introduce dead volumes, for example, during purging of reactant gases. The formation of dead volumes can reduce the efficiency and effectiveness of the deposition process. The curved and angled flow pathways of the arrangement shown in FIG. 2A may also create a "throw" onto the substrate. For example, the use of the curved pathway 180 can impart angular momentum to the gas, which can introduce non-uniformities on the substrate.

Moreover, as explained in more detail below in connection with FIG. 3A, and as shown in FIG. 1, the manifold 100 of FIG. 2A utilizes polymeric o-rings 210 (shown in FIG. 2A but labeled in FIGS. 1 and 3A), as seals between adjacent blocks, e.g., between adjacent ones of the vertically stacked blocks 104, 106a, 106b, 108 and associated sub-blocks, as well as between the laterally adjacent valve blocks 112a, 112b (also referred to as "tombstones" herein) and the manifold body 102. However, the use of polymeric o-rings may be permeable to gases, such as atmospheric gases entering the manifold 100 from the outside environs. For example, oxygen and/or moisture may penetrate the polymeric o-rings and enter the bore 130, which can contaminate the deposition processes. Further, as shown in FIG. 1, the o-rings 210 can allow oxygen to enter the manifold body 102, which can create a flaky film at the o-ring interface with the manifold body 102.

Figure 2B:
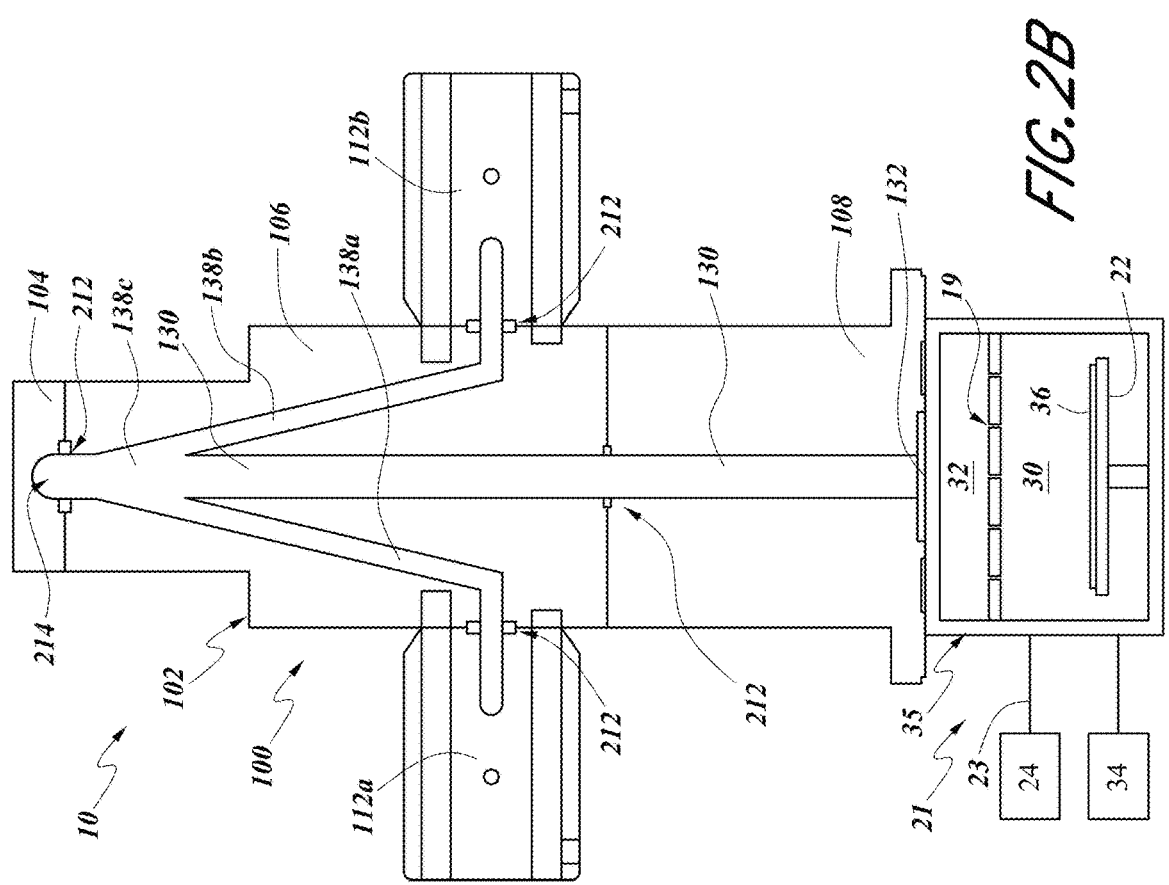
FIG. 2B is a cross sectional view of an embodiment of a semiconductor processing device.
Figure 2A:
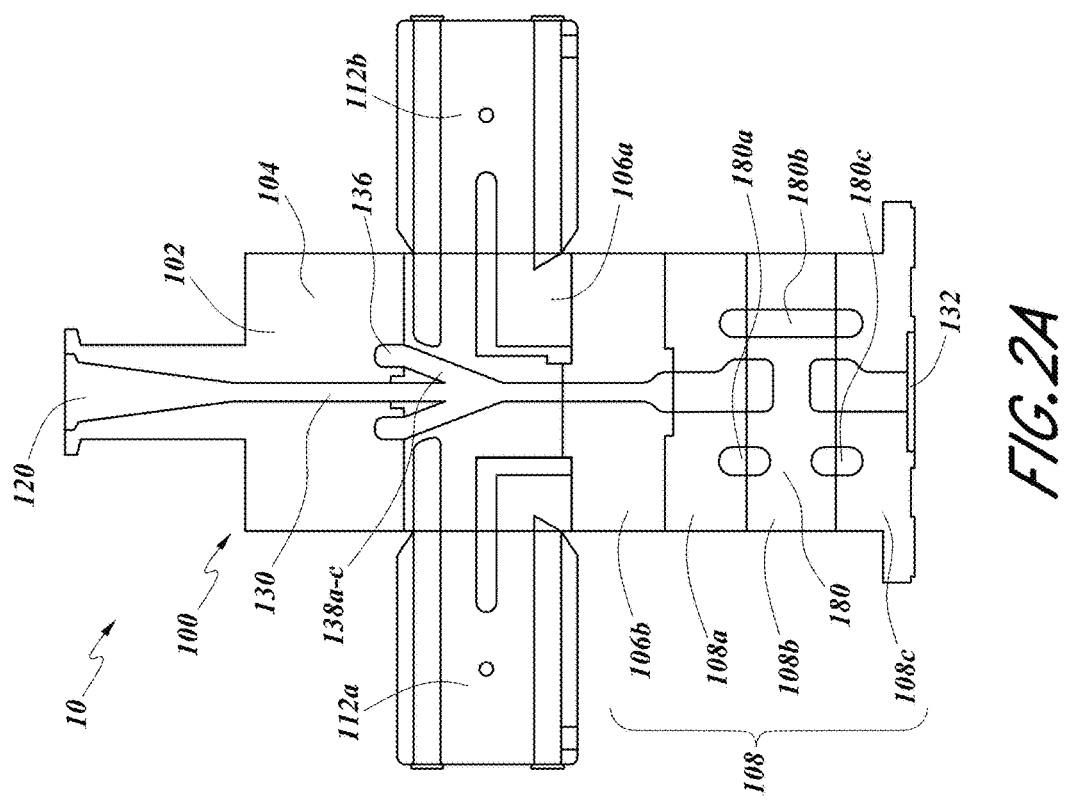
FIG. 2A is a cross sectional view of the semiconductor processing device of FIG. 1.

FIG. 2B is a schematic side sectional view of an improved semiconductor processing device 10 according to one embodiment. Unless otherwise noted, components of FIG. 2B may be generally similar to or the same as like-numbered components of FIG. 2A. For example, the device 10 of FIG. 2B can include a manifold 100 that defines a bore 130 through a manifold body 102. As with FIG. 2A, in the embodiment of FIG. 2B the manifold 100 can be constructed by mounting multiple blocks to one another. For example, as shown in FIG. 2B, an upper block 104 can be mounted to an intermediate block 106. The intermediate block 106 can be mounted to a lower block 108, which can include an outlet 132. As explained herein and in Paragraph [0049] of U.S. Patent Publication No. 2017/0350011 the use of multiple blocks can enable a modular construction of the module, including curved, angled, or other complex geometries. First and second valve blocks 112a, 112b can also be mounted to the manifold body 102.

Supply lines 138a-138c can be provided to supply gas from corresponding gas distribution channels to the bore 130. Unlike the embodiment of FIG. 2A, the channels 138A-138c of FIG. 2B can be angled upwardly away from the outlet 132 and the downstream reaction chamber relative to their initial entry location in the intermediate block 106. The supply channels 138a-138c can delimit an acute angle as measured between the supply channels 138a-138c and the bore 130. The upper ends of the supply channels 138a-138c can terminate or merge into an impingement surface 214, which may direct the supplied gas(es) downwardly through the bore 130. The impingement surface 214 of FIG. 2B can comprise a curved surface shaped so as to efficiently direct the gases impinging on the surface 214 at an angle back down through the bore 130. In FIG. 2B, the impingement surface 214 and the outlet 132 can be disposed along a linear longitudinal axis of the bore 130. Thus, unlike FIG. 2A in which an inert gas inlet 120 is provided in the upper block 104, in the embodiment of FIG. 2B, the uppermost portion of the upper block 104 is capped, such that the supplied gases, including reactant and inert gases, are provided from the side of the manifold 100.

The bore 130 of the manifold body 102 can deliver reactant and/or inactive gases to a reaction chamber 30 of a reactor 21 by way of the outlet 132 at the bottom of the manifold body 102. A dispersion device 35, such as a showerhead as shown, or a horizontal injection device in other embodiments, can include a plenum 32 in fluid communication with a plurality of openings 19. The reactant vapor can pass through the openings 19 and be supplied into the reaction chamber 30. A substrate support 22 can be configured, or sized and shaped, to support a substrate 36, such as a wafer, within the reaction chamber 30. The dispersed reactant vapor can contact the substrate and react to form a layer (e.g., a monolayer) on the substrate. The dispersion device 35 can disperse the reactant vapor in a manner so as to form a uniform layer on the substrate.

An exhaust line 23 can be in fluid communication with the reaction chamber 30. A vacuum pump 24 can apply suction to the exhaust line 23 to evacuate vapors and excess materials from the reaction chamber 30. The reactor 21 can comprise any suitable type of semiconductor reactor, such as an atomic layer deposition (ALD) device, a chemical vapor deposition (CVD) device, etc. Moreover, the device 10 can comprise a control system 34 in electronic and data communication with the reactor 21. The control system 34 can comprise one or a plurality of processors configured to control the operation of the device 10. Additional components may be provided to manage the operation of the device 10.

Beneficially, the use of the upwardly angled supply channels 138a-138c and the impingement surface 214 can provide an extended mixing length along which gases can become uniformly mixed. Moreover, the extended mixing length provided by the channels 138a-138c can reduce the effects of "throw" or spiral/helical flow effect that may result when the curved pathway 180 of FIG. 2A is used, as well as the dead volumes that may result due to the curved and turning channels along the pathway 180. The "throw" effects may also be mitigated by angling only in a vertical plane, for example, instead of angling laterally.

Also, in FIG. 2B, the o-rings 210 of FIGS. 1 and 2A (and called out in FIG. 3A) can be replaced with metallic seals 212 disposed between adjacent blocks. The metallic seals 212 can comprise any suitable type of metallic seal. The metallic seals 212 can be provided at the interfaces between adjacent blocks and can be disposed at least partially about the bore 130, or at least partially about other adjoining passageways or channels, such as supply channels, gas distribution channels, etc. In the illustrated embodiments, the metallic seals 212 comprise C seals, in which the seal comprises a C-shaped toroidal member, with gap or disconnected portion at an outer periphery of the seal. When adjacent blocks are pressed together, the gap can be reduced such that opposing edges of the seal contact one another. Other types of seals may be suitable, including, for example, W seals. The metallic seal 212 can comprise any suitable type of metal, such as steel. The metallic seal 212 can provide an impermeable barrier to inhibit gases from entering or exiting the bore 130 along the block interfaces.

FIG. 3A is a schematic side view showing the approximate location of some of the many o-rings 210 in the device 10 of FIG. 2A at interfaces between the blocks of the manifold tower or body 102 and valve blocks 112a, 112b. FIG. 3B is a schematic side view showing the approximate locations of metallic rings 212 in the device 10 of FIG. 2B. Unless otherwise noted, the reference numerals of FIGS. 3A-3B represent components that are the same as or generally similar to like-numbered components of FIGS. 2A-2B. FIGS. 3A-3B also illustrate reactant valves 116a, 116b mounted to the respective valve blocks 112a, 112b. A gas injector can be provided downstream of and adjacent the outlet 132 of the bore 130 to provide gases to a downstream reaction chamber (not shown) designed to house one or more substrates. In some embodiments, the gas injector can comprise an open volume between the bore 130 of the manifold 100 and the reaction chamber. In some embodiments, a gas dispersion device 820 can be provided between the bore 130 of the manifold 100 and the reaction chamber. In FIG. 3A, such a gas dispersion device comprises a showerhead plenum and showerhead plate. In other arrangements, the manifold could be provided at the side of a chamber, with or without a gas dispersion device to inject the gases into the reaction chamber.

In the arrangement of FIG. 3A, the device 10 includes fourteen (14) o-rings 210. On the manifold tower 100, each dot shows one half of an o-ring 210 for the o-rings 210 provided on the manifold 100; however, the dots shown between the valve blocks 112a, 112b and the manifold body 102, and between the distribution lines and the valve blocks 112a, 112b, are shown schematically (not in cross-section). There is an o-ring 210 between the Source 1 line and the valve block 112a, between the Source 2 line and the valve block 112b, between a first purge line (Purge N2) and the valve block 112a, and between a second purge line (Purge N2) and the valve block 112b. There is a seal in the form of an o-ring 210 between the first valve block 112a and the first intermediate block 106a, and between the second valve block 112b and the first intermediate block 106a. Two (2) o-rings are provided between the upper block 4 and the first intermediate block 106a. Three (3) o-rings 210 are provided between the first intermediate block 106a and the second intermediate block 106b. There is an o-ring between the second intermediate block 106b and the first lower block 108a, between the first lower block 108a and the second lower block 108b, and between the second lower block 108b and the third lower block 108c.

Turning to FIG. 3B, the construction of the manifold 100 can beneficially reduce the number of seals between blocks, so as to simplify the design and improve sealability. For example, in FIG. 3B, only eight (8) seals 212 are used in the manifold 100. For the illustrated embodiment, metallic seals 212 are employed in place of polymeric o-rings. The metallic seals can be o-rings, W-rings or C-rings. As with FIG. 3A, there is a seal 212 between Source 1 and valve block 112a, between the Source 2 line and the valve block 112b, between the first purge line (Purge N2) and the valve block 112a, and between the second purge line (Purge N2) and the valve block 112b. One (1) metallic seal 212 is provided between the upper block 104 and the intermediate block 106. One (1) metallic seal 212 is disposed between the intermediate block 106 and the lower block 108. One (1) metallic seal 212 is disposed between the valve block 112a and the intermediate block 106, and one (1) metallic seal 212 is disposed between the valve block 112b and the intermediate block 106. Accordingly, in the illustrated embodiment, fewer seals can be used as compared with the implementation of FIG. 3A, particularly within or on the manifold tower or body 102.

FIG. 4 is a schematic system diagram of the device 10 shown in FIGS. 1, 2B and 3B. In the arrangement shown in FIG. 4, four (4) reactant or source gases R1-R4 can be provided sequentially and/or simultaneously, in various combinations, to the manifold 100. For example, the first reactant valve 116a (which can be mounted on valve block 112a) can be configured to controllably supply a first reactant R1 to the manifold 100. The second reactant valve 116b (which can be mounted on valve block 112b) can be configured to controllably supply a second reactant R2 to the manifold 100. The third reactant valve 116c (which may not be mounted on a dedicated valve block) can be configured to controllably supply a third reactant R3 to the manifold 100. The fourth reactant valve 116d (which may not be mounted on a dedicated valve block) can be configured to controllably supply a fourth reactant R4 to the manifold 100. Inert gas valves 114a-114c can be configured to controllably supply a high flow inert gas along the reactant gas supply lines for purging and/or to serve as a carrier gas for the reactants R1-R4. Restrictors 117a-117b can be provided to lower the flow of the inert gas from the valves 114a-114c, for example, when the inert gas is to be used as a carrier gas for the respective reactant R1-R4. FIG. 4 represents only one non-limiting valve scheme that can be provided for use with the manifold of FIGS. 2B and 3B.

Although the foregoing has been described in detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention. Moreover, not all of the features, aspects and advantages described herein above are necessarily required to practice the present invention.

What is claimed is:

1. A semiconductor processing device comprising:
   a manifold comprising:
      a bore configured to deliver a gas to a reaction chamber;
      a first block mounted to a second block, the first and second mounted blocks cooperating to at least partially define the bore; and
      a supply channel that provides fluid communication between a gas source and the bore, the supply channel disposed at least partially in the second block;
   a metallic seal disposed about the bore at an interface between the first and second block; and
   an outlet at a lower portion of the manifold,
   wherein the supply channel is angled upwardly away from the outlet and inwardly towards the bore.

2. The semiconductor processing device of claim 1, wherein the metallic seal comprises a C seal.

3. The semiconductor processing device of claim 1, wherein the metallic seal comprises steel.

4. The semiconductor processing device of claim 1, wherein the metallic seal comprises a W seal.

5. The semiconductor processing device of claim 1, wherein the first block comprises an impingement surface at an upper portion of the manifold, the impingement surface shaped to redirect gas downwardly through the bore to the outlet.

6. The semiconductor processing device of claim 5, wherein the impingement surface and the outlet are disposed along a longitudinal axis of the bore.

7. The semiconductor processing device of claim 1, further comprising a third block mounted to and below the second block, a second metallic seal between the second and third blocks and at least partially disposed about the bore, wherein the second and third blocks cooperate to at least partially define the bore.

8. The semiconductor processing device of claim 7, wherein the outlet is at least partially defined by the third block.

9. The semiconductor processing device of claim 1, further comprising a gas dispersion device downstream of the outlet, the gas dispersion device configured to disperse a flow of the gas into the reaction chamber.

10. The semiconductor processing device of claim 9, further comprising the reaction chamber downstream of the gas dispersion device, the reaction chamber configured to receive a substrate.

11. The semiconductor processing device of claim 1, further comprising a valve block mounted to the first second block and a second metallic seal disposed between the valve block and the first block, a reactant gas valve mounted to or coupled with the valve block.

12. A semiconductor processing device comprising:
a manifold comprising:
    a bore configured to deliver a gas to a reaction chamber; and
    an impingement surface at an upper portion of the manifold;
an outlet at a lower portion of the manifold; and
a supply channel that provides fluid communication between a gas source and the bore,
    wherein the supply channel is angled upwardly away from the outlet and inwardly towards the bore, the supply channel oriented to direct gas upwardly towards the impingement surface, and
    wherein the impingement surface is shaped to redirect gas downwardly through the bore to the outlet.

13. The semiconductor processing device of claim 12, wherein the manifold comprises a first block mounted to a second block, the first and second mounted blocks cooperating to at least partially define the bore, the first block comprising the impingement surface.

14. The semiconductor processing device of claim 13, further comprising a metallic seal disposed at least partially about the bore between the first and second blocks.

15. The semiconductor processing device of claim 12, wherein the impingement surface and the outlet are disposed along a longitudinal axis of the bore.

16. The semiconductor processing device of claim 12, further comprising a showerhead below the outlet, the showerhead configured to laterally disperse a flow of the gas.

17. The semiconductor processing device of claim 16, further comprising the reaction chamber below the showerhead, the reaction chamber configured to receive a substrate.

18. The semiconductor processing device of claim 12, wherein the outlet opens without restriction into the reaction chamber configured to house one or more substrates.

\* \* \* \* \*

UNITED STATES PATENT AND TRADEMARK OFFICE
CERTIFICATE OF CORRECTION

| | |
|---|---|
| PATENT NO. | : 11,492,701 B2 |
| APPLICATION NO. | : 16/813527 |
| DATED | : November 8, 2022 |
| INVENTOR(S) | : Dinkar Nandwana |

It is certified that error appears in the above-identified patent and that said Letters Patent is hereby corrected as shown below:

On the Title Page

Page 3, Column 1 (item (56) U.S. Patent Documents), Line 36, delete "0002881" and insert -- 0028810 --.

Page 3, Column 1 (item (56) U.S. Patent Documents), Line 75, delete "0027161" and insert -- 0271610 --.

Page 4, Column 2 (item (56) Other Publications), Line 14, delete "Tugsten" and insert -- Tungsten --.

In the Claims

Column 11, Line 20, Claim 11, after "the" delete "first".

Signed and Sealed this
Twenty-first Day of February, 2023

Katherine Kelly Vidal
*Director of the United States Patent and Trademark Office*